United States Patent
Chang

(10) Patent No.: US 6,781,845 B2
(45) Date of Patent: Aug. 24, 2004

(54) PARALLEL PRINTED CIRCUIT BOARD ASSEMBLY

(75) Inventor: Cheng Kuo Chang, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 56 days.

(21) Appl. No.: 10/319,286

(22) Filed: Dec. 13, 2002

(65) Prior Publication Data

US 2004/0052059 A1 Mar. 18, 2004

(30) Foreign Application Priority Data

Sep. 13, 2002 (TW) ..................................... 91214416 U

(51) Int. Cl.⁷ .............................................. H05K 1/14
(52) U.S. Cl. ..................... 361/736; 361/742; 361/803; 361/785; 439/65; 439/74; 439/680; 439/674; 439/677; 439/75
(58) Field of Search ............................. 361/736, 742, 361/803, 785; 439/65, 74, 680, 674, 677, 75

(56) References Cited

U.S. PATENT DOCUMENTS

| | | | | |
|---|---|---|---|---|
| 4,133,592 A | * | 1/1979 | Cobaugh et al. | 439/74 |
| 4,993,965 A | * | 2/1991 | Eck | 439/374 |
| 5,498,167 A | * | 3/1996 | Seto et al. | 439/74 |
| 5,707,242 A | * | 1/1998 | Mitra et al. | 439/74 |
| 5,842,874 A | * | 12/1998 | Yagi et al. | 439/74 |
| 6,039,581 A | * | 3/2000 | DiMarco | 439/74 |
| 6,431,879 B2 | * | 8/2002 | Brekosky et al. | 439/74 |

* cited by examiner

Primary Examiner—Evan Pert
Assistant Examiner—Thanh Y. Tran
(74) Attorney, Agent, or Firm—Wei Te Chung

(57) ABSTRACT

A parallel printed circuit board assembly includes a main circuit board (1) and an auxiliary circuit board (2). The main circuit board has a surface (14) with a plug connector (32) and a receptacle connector (44) mounted thereon. The auxiliary circuit board has a surface (22) with a plug connector (42) and a receptacle connector (34) mounted thereon. The plug and receptacle connectors of the main circuit board respectively mate with the receptacle and plug connectors of the auxiliary circuit board. Because of the arrangement of the plug and receptacle connectors on the main and auxiliary circuit boards, the circuit boards can only connect with one another in one correct way.

4 Claims, 3 Drawing Sheets

PARALLEL PRINTED CIRCUIT BOARD ASSEMBLY

BACKGROUND OF THE INVENTION

1. Field of the Invention

The present invention relates generally to a circuit board assembly, and more particularly to a circuit board assembly having parallel printed circuit boards.

2. Description of Prior Art

Two printed circuit boards are ordinarily connected perpendicular to or parallel to one another. Parallel connection is usually adopted in portable electrical devices, such as notebooks or PDAs. In such an arrangement, a plurality of printed circuit boards are stacked in parallel with electrical connectors connected therebetween.

U.S. Pat. No. 4,929,185 discloses a conventional parallel circuit board assembly which comprises a main circuit board and an auxiliary circuit board. Two receptacle electrical connectors are mounted on the auxiliary circuit board, and two plug electrical connectors are mounted on the main circuit board. The two circuit boards are electrically connected together by mating the plug connectors and the receptacle connectors.

However, the conventional parallel circuit board assembly has a shortcoming. When the auxiliary circuit board is rotated a 180 angle, the receptacle connectors of the auxiliary circuit board also can mate with the plug connectors of the main circuit board. Therefore, an incorrect coupling of the two circuit boards can result.

A parallel circuit board assembly which can prevent mistaken connection of two circuit boards is desired.

SUMMARY OF THE INVENTION

Accordingly, an object of the present invention is to provide a parallel printed circuit board assembly having two circuit boards which are prevented from being incorrectly connected together.

To achieve the above object, a parallel printed circuit board assembly in accordance with the present invention includes a main circuit board and an auxiliary circuit board. The main circuit board has a surface with a plug and receptacle connectors mounted thereon. The auxiliary circuit board has a surface with a plug and receptacle connectors mounted thereon. The plug and receptacle connectors of the main circuit board respectively mate with the receptacle and plug connectors of the auxiliary circuit board.

BRIEF DESCRIPTION OF THE DRAWINGS

Other objects, advantages and novel features of the present invention will be drawn from the following detailed description of a preferred embodiment of the present invention with attached drawings, in which.

DETAILED DESCRIPTION OF PREFERRED EMBODIMENT

Figure 1:
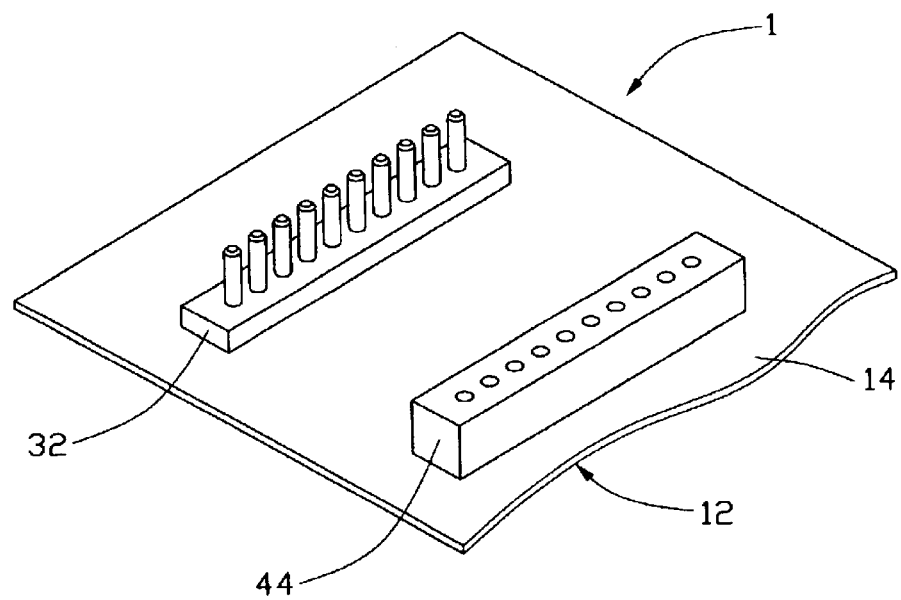
FIG. 1 is a perspective view of a main circuit board of a parallel printed circuit board assembly of the present invention.

Referring to FIGS. 1–4, a parallel printed circuit board assembly in accordance with the present invention comprises a main circuit board 1, an auxiliary circuit board 2 and a first and second board-to-board connectors 3, 4.

The main circuit board 1 has a first surface 12 and a second surface 14. The auxiliary circuit board 2 has a first surface 22 and a second surface 24. A plurality of electrical elements (not shown) are respectively disposed on the main circuit board 1 and on the auxiliary circuit board 2.

The first board-to-board connector 3 has a first plug connector 32 and a first receptacle connector 34, said the first plug and receptacle connector 32, 34 respectively having a plurality of electrical contacts (not shown) electrically connecting with the circuit boards 1, 2. The second board-to-board connector 4 has a second plug connector 42 and a second receptacle connector 44, said the second plug and receptacle connector 42, 44 respectively having a plurality of electrical contacts (not shown) electrically connecting with the circuit boards 2, 1.

Figure 2:
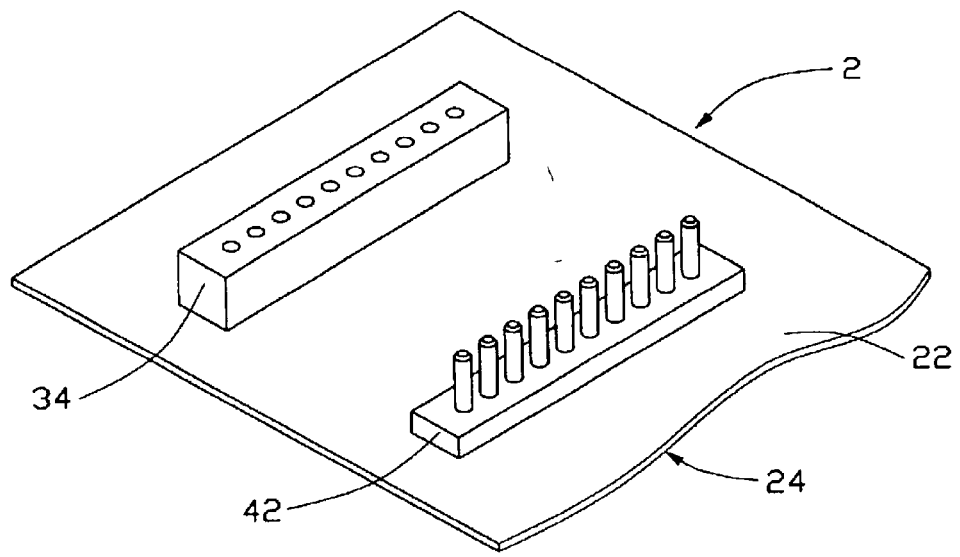
FIG. 2 is a perspective view of an auxiliary circuit board of the parallel printed circuit board assembly of the present invention.
Figure 3:
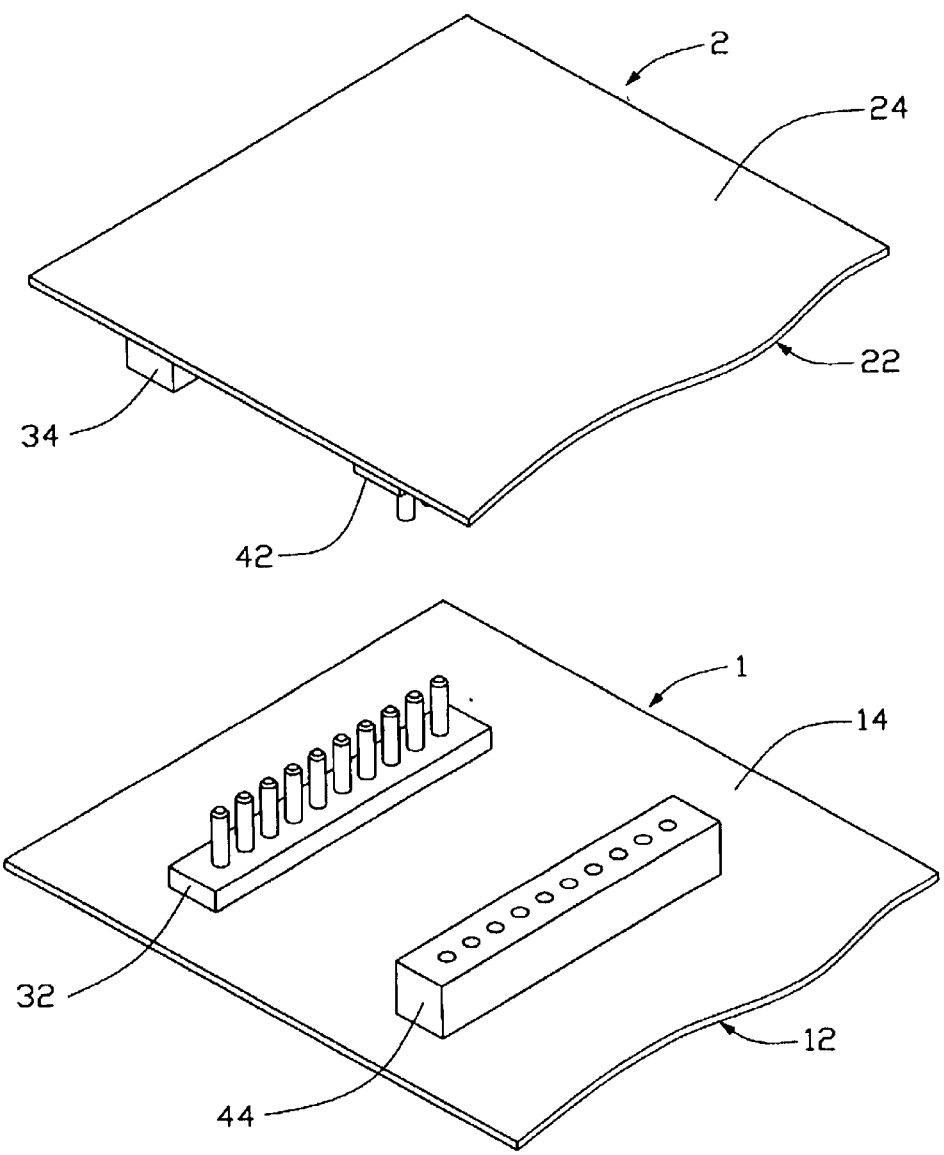
FIG. 3 is an exploded view of a parallel printed circuit board assembly with the main and auxiliary circuit boards.
Figure 4:
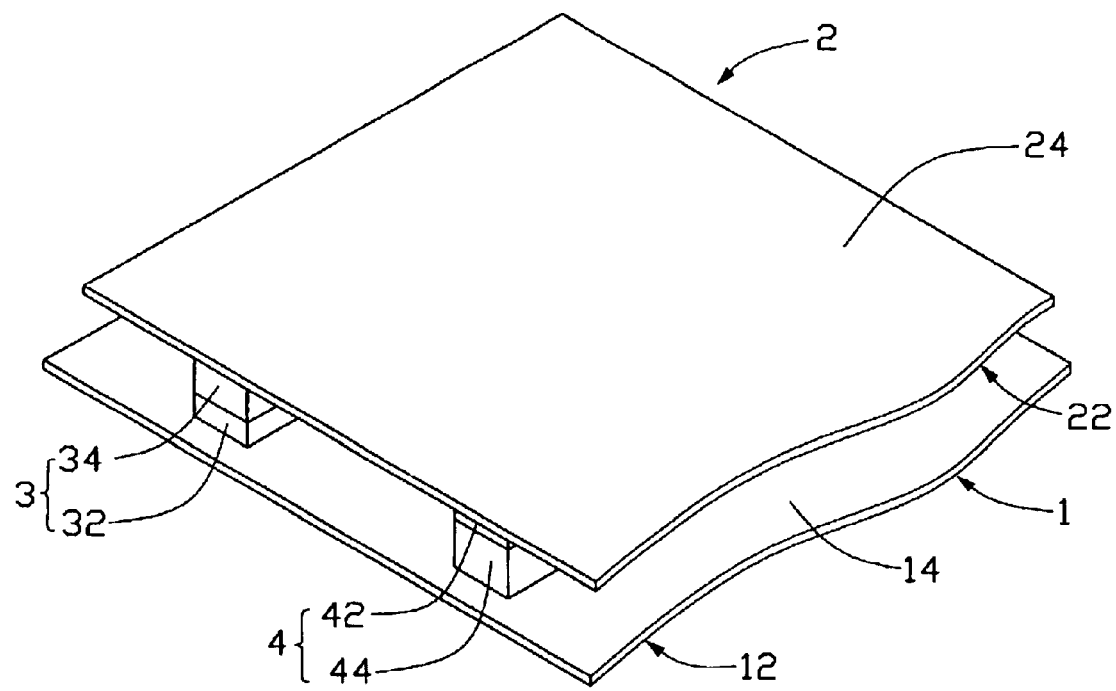
FIG. 4 is a perspective view of a parallel printed circuit board assembly with the main and auxiliary circuit boards.

Referring to FIGS. 1 and 2, the first plug connector 32 and the second receptacle connector 44 are arranged parallel to one another on the second surface 14 of the main circuit board 1. The first receptacle connector 34 and the second plug connector 42 are arranged parallel to one another on the first surface 22 of the auxiliary circuit board 2. Referring to FIGS. 3 and 4, the main and auxiliary circuit boards 1, 2 are oriented parallel to one another, the first surface 22 of the auxiliary circuit board 2 facing the second surface 14 of the main circuit board 1. The first plug connector 32 of the main circuit board 1 faces and mates with the first receptacle connector 34 of the auxiliary circuit board 2, and the second receptacle connector 44 of the main circuit board 1 faces and mates with the second plug connector 42 of the auxiliary circuit board 2. Thus the main and auxiliary circuit boards are electrically connected together.

Compared with the conventional parallel printed circuit board assembly, when the auxiliary circuit board 2 is rotated a 180 degree angle, the second plug connector 42 and the first receptacle connector 34 of the auxiliary circuit board 2 respectively face the first plug connect 32 and the second receptacle connector 44 of the main circuit board 1, and they can not be mated together. So incorrect connection of the two circuit boards can be avoided.

Although the present invention has been described with reference to a specific embodiment, it should be noted that the described embodiment is not necessarily exclusive and that various changes and modifications may be made to the described embodiment without departing from the scope of the invention as defined by the appended claims.

What is claimed is:

1. A parallel printed circuit board assembly comprising:
   a first circuit board with a plug connector and a receptacle connector discrete from each other while commonly mounted thereon and electrically connected thereto; and
   a second circuit board with a plug connector and a receptacle connector discrete from each other while commonly mounted thereon and electrically connected thereto;
   wherein, each plug connector has a plurality of contacts parallel extending outwardly, the plug and receptacle connectors of each circuit board are parallel to each other, and the first circuit board is arranged face-to-face with the second circuit board and the plug connector of the second circuit board mates with the receptacle connector of the first circuit board and the receptacle connector of the second circuit board mates with the plug connector of the first circuit board.

2. The parallel printed circuit board assembly in accordance with claim 1, wherein the plug and receptacle connectors of each circuit board respectively comprise a plurality of electrical contacts.

3. The parallel printed circuit board assembly in accordance with claim 2, wherein a plurality of electrical elements are disposed on the first and second circuit boards.

4. A method of connecting two printed circuit board in correct orientation thereof, comprising steps of:

provided first and second printed circuit boards face to face parallel to each other;

mounting a pair of discrete connectors, which are mateable and complementary with other, on said first printed circuit board in a spatial parallel relation;

mounting another pair of discrete connectors, identical to said pair of connectors, on said second printed circuit board in a similar spatial a parallel relation wherein one of said pair of connectors on the first printed circuit board has a plurality of contacts parallel extending outwardly, and one of said another pair of connectors on the second printed circuit board has a plurality of contacts parallel extending outwardly; wherein one of said pair of connectors on the first printed circuit board are mated with the other of said another pair of connectors on the second printed circuit board, and the other of said pair of connectors on the first printed circuit board are mated with the one of said another pair of connectors on the second printed circuit board, when said first and second printed circuit boards are correctly oriented during assembling; otherwise, the one of said pair of connectors on the first printed circuit board conflicts with the same one of said another pair of connectors on the second connector, and said other of said pair of connectors on the first printed circuit board conflicts with the same other of said another pair of connectors on the second printed circuit board, when said first and second printed circuit boards are incorrectly oriented with each other during mating.

* * * * *